(12) United States Patent
Li et al.

(10) Patent No.: US 11,971,057 B2
(45) Date of Patent: Apr. 30, 2024

(54) GAS TRANSPORT SYSTEM

(71) Applicant: Taiwan Semiconductor Manufacturing Co., Ltd., Hsinchu (TW)

(72) Inventors: Jheng-Syun Li, Hsinchu (TW); Mao-Chou Huang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 474 days.

(21) Appl. No.: 17/097,820

(22) Filed: Nov. 13, 2020

(65) Prior Publication Data
US 2022/0154745 A1 May 19, 2022

(51) Int. Cl.
*F15D 1/06* (2006.01)
*C23C 16/44* (2006.01)
*C23C 16/455* (2006.01)
*C23C 16/50* (2006.01)
*H01J 37/32* (2006.01)
*H01L 21/67* (2006.01)

(52) U.S. Cl.
CPC ............ *F15D 1/06* (2013.01); *C23C 16/4412* (2013.01); *C23C 16/45519* (2013.01); *C23C 16/50* (2013.01); *H01J 37/3244* (2013.01); *H01L 21/67017* (2013.01); *H01J 37/32082* (2013.01); *H01J 2237/3321* (2013.01)

(58) Field of Classification Search
CPC . F15D 1/06; C23C 16/4412; C23C 16/45519; H01J 37/3244
See application file for complete search history.

(56) References Cited

U.S. PATENT DOCUMENTS

| 6,274,196 | B1 | 8/2001 | Amano et al. |
| 9,234,278 | B2 | 1/2016 | Chou et al. |
| 9,741,575 | B2 | 8/2017 | Lin et al. |
| 10,450,655 | B2 | 10/2019 | Fang et al. |
| 2008/0041448 | A1 | 2/2008 | Park |
| 2012/0070581 | A1 | 3/2012 | Monsma et al. |
| 2016/0362785 | A1 | 12/2016 | Kim et al. |
| 2020/0181798 | A1 | 6/2020 | Mabuchi et al. |

FOREIGN PATENT DOCUMENTS

| CN | 101326305 A | 12/2008 |
| CN | 102498557 A | 6/2012 |
| CN | 103510069 A | 1/2014 |
| CN | 206143306 U | 5/2017 |
| CN | 107109645 A | 8/2017 |
| CN | 207405235 U | 5/2018 |
| CN | 209522919 U | 10/2019 |
| CN | 110527979 A | 12/2019 |
| CN | 110565161 A | 12/2019 |
| CN | 111128788 A | 5/2020 |

(Continued)

*Primary Examiner* — Atif H Chaudry
(74) *Attorney, Agent, or Firm* — Seed IP Law Group LLP

(57) ABSTRACT

A conduit system for transporting gas from a gas containing chamber for processing a substrate from which semiconductor devices are formed includes a liner with a spiral vent. The conduit system utilizes a curtain of gas to prevent or reduce deposition of material onto an inner surface of the conduit transporting the gas from the gas containing chamber.

20 Claims, 8 Drawing Sheets

(56) References Cited

FOREIGN PATENT DOCUMENTS

| | | | |
|---|---|---|---|
| DE | 3901301 | A1 | 7/1990 |
| JP | H11237046 | A * | 8/1999 |
| KR | 20100080228 | A * | 7/2010 |
| TW | 522040 | B | 3/2003 |
| TW | 200710928 | A | 3/2007 |
| WO | 2005/014165 | A1 | 2/2005 |
| WO | 2019/208124 | A1 | 10/2019 |

* cited by examiner

GAS TRANSPORT SYSTEM

BACKGROUND

Semiconductor device fabrication is a process used to create integrated circuits that are present in everyday electrical and electronic devices. The fabrication process is a multiple-step sequence of photolithographic and chemical processing steps during which electronic circuits are gradually created on a wafer composed of a semiconducting material.

The various processing steps fall into a number of categories including deposition, removal, patterning, and modification of electrical properties (i.e., doping). Chemical vapor deposition (CVD) is one of a number of commonly used processes for performing deposition processing steps. Typically, a CVD process involves exposing a wafer or substrate to one or more volatile precursors, usually in the form of gases, which react and/or decompose on the wafer surface to produce a deposited layer. CVD processes are commonly used in semiconductor fabrication to form layers of polysilicon, silicon dioxide and silicon nitride.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
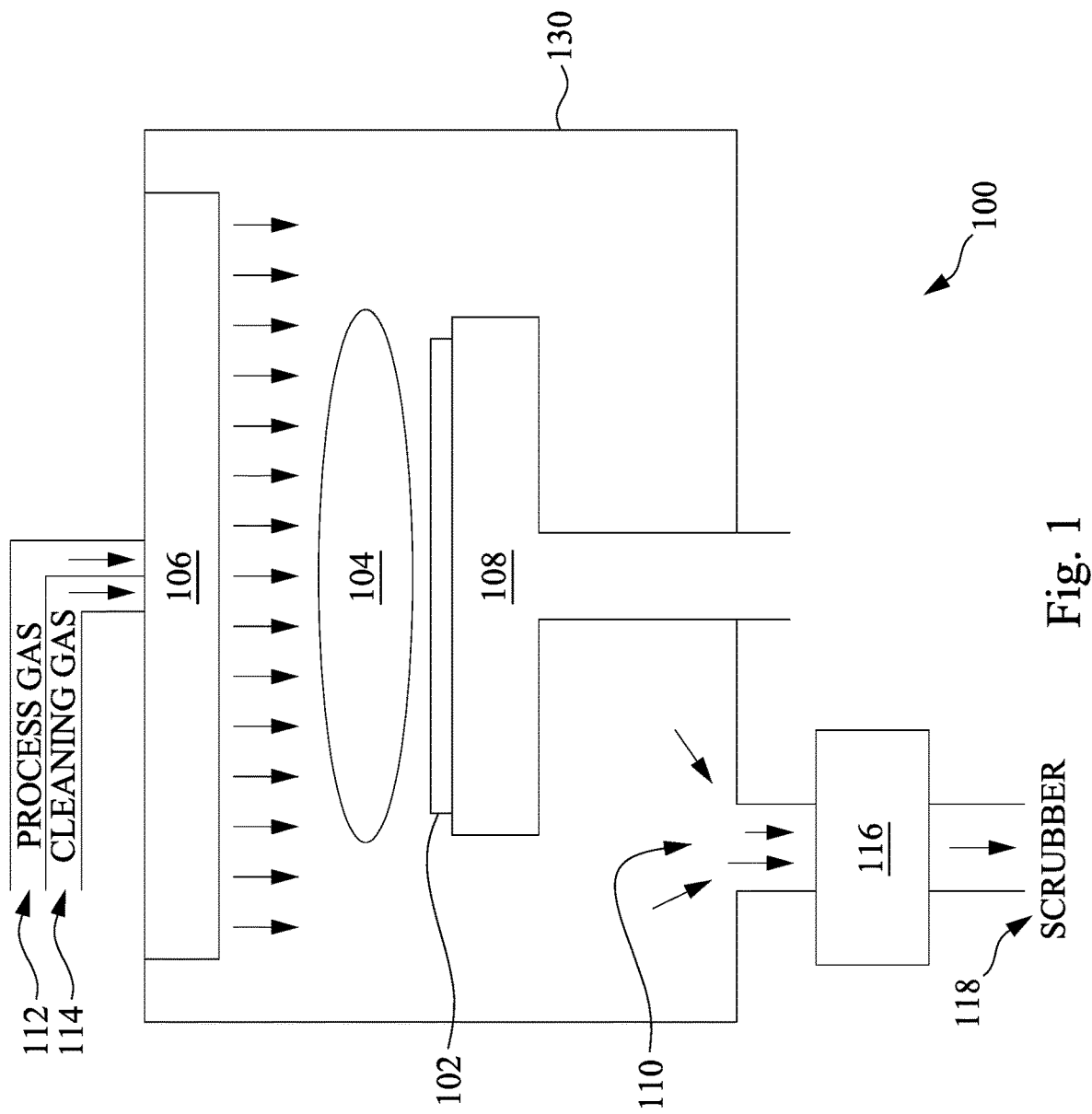
FIG. 1 is a schematic cross-sectional view of a chamber for processing a substrate using a gas plasma for use with embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One embodiment described herein is a gas curtain device useful for preventing or reducing deposition of material on an inner surface of a conduit used for transporting exhaust gas from a gas containing chamber in which a substrate for semiconductor devices is processed. Preventing or reducing deposition of material on inner surfaces of such conduits extends the time between cleanings which has the effect of increasing the number of substrates that can be processed before cleaning is necessary. This results in an increased throughput for the chamber. Other embodiments of the present disclosure include a conduit system for transporting a gas, e.g., an exhaust gas, from a gas containing chamber in which a substrate for semiconductor devices is processed. Other embodiments, include methods for transporting a gas, e.g., an exhaust gas, from a gas containing chamber in which a substrate for semiconductor devices is processed.

Many semiconductor fabrication processes involve utilizing a pump to pull vapor or materials from a chamber. The vapor or materials are pulled to a scrubber or other location with a particular rate or flow rate. The pump pulls the vapor or materials from various positions within the chamber at varied rates depending on the positioning of an exit point or location and the relation of the various positions to the exit point.

One example of a semiconductor process that utilizes a pump to pull materials from a chamber is chemical vapor deposition (CVD). In a CVD chamber a semiconductor device or wafer is exposed to a precursor in the form of a vapor. The precursor reacts with a surface of the semiconductor device and deposits and forms a layer of material as a film. The pump pulls vapor or gases out of the chamber. The vapor will include precursor gases fed to the chamber which have not reacted with the surface of the semiconductor substrate or device and byproducts of the process carried out in the chamber. Some of these gases, e.g., unreacted gases, byproducts or products resulting from the interaction between the precursor gases and the byproduct gases can deposit on surfaces of conduits that are used to transport the gases away from the chamber. Over time as the deposited materials build up within the conduits, the deposited materials reduce the open space (e.g., reduce a diameter of the void space within the conduit) within the conduit through which the gases can flow. This plugging or clogging of the conduit will place more burden on the pump to draw the same volume of gas from the chamber compared to drawing the same volume of gas through the conduit in the absence of the deposits. In addition, this buildup of materials within the conduit can affect the pressure within the chamber, which in turn will affect results of the process carried out in the chamber.

The present disclosure describes devices and methods for reducing formation of deposits on the inside of conduits carrying gases from a gas processing chamber, such as a CVD chamber. The devices include a liner that forms a gas curtain within the conduits. The gas curtain isolates the wall of the conduit from the materials that might deposit on the conduit wall and thereby impedes deposition of material on the inner surface of a conduit containing the liner. As a result, deposition of material on the inside surface of the conduits is reduced or prevented and more uniform results are obtained from the process carried out in the chamber.

An embodiment of the present disclosure is described with reference to a chemical vapor deposition chamber (CVD); however embodiments of the present disclosure are not limited to practice with a CVD chamber. Embodiments in accordance with the present disclosure can be practiced with other chambers from which a process gas is exhausted via a conduit wherein the process gases are susceptible to depositing on an inside surface of the conduit or otherwise interacting with the inner surface of the conduit in a way that results in the buildup of material on the inner surface of the conduit. These alternative process chambers can be used to form films on substrate surfaces or remove portions of films from a substrate surface.

FIG. 1 is a cross sectional diagram illustrating a non-limiting example of a CVD process system 100. The system 100 utilizes plasma 104 and an RF frequency to deposit material onto a substrate, e.g., a wafer or semiconductor device 102. The system 100 includes a plasma 104, a showerhead 106, a chamber 130, a heater 108, a byproduct exit location or port 110, a process gas 112, a cleaning gas 114, a pump 116, and a scrubber 118. A wafer 102 is processed in CVD process system 100. The wafer 102 is utilized to fabricate a semiconductor device through a number of processing steps. The wafer 102 has a substrate or body comprised of a semiconductor material, such as silicon. The wafer 102 can be divided or arranged with a series of dies. The wafer 102 includes larger sized wafers, such as 440 mm diameter sized wafers. Smaller sized wafers, e.g., 200 mm diameter sized wafers can also be processed in this CVD process system.

The plasma 104 is a gas that includes a substantial percentage of atoms or molecules that are ionized. The plasma 104 is generally created by applying an electric field between electrodes in the presence of a process gas 112. The electrodes, in this example, are the showerhead 106 and the heater 108. The process gas 112 fills the void or space between the showerhead 106 and the heater 108. In one example, the electric field is an RF or AC frequency based electric field. In another example, the electric filed is a DC field. In other embodiments in accordance with the present disclosure, a plasma 104 is not utilized, e.g., the CVD chamber is an atmospheric pressure CVD or a metal organic CVD. The films deposited using a plasma-enhanced CVD (PECVD) include silicon nitride ($Si_xN_y$), silicon dioxide ($SiO_2$), silicon oxynitride ($SiO_xN_y$), silicon carbide (SiC), and amorphous silicon (alpha.-Si). Silane ($SiH_4$), the silicon source gas, is combined with an oxygen source gas to form silicon dioxide or a nitrogen gas source to produce silicon nitride. In some embodiments, a tetraethylorthosilicate material is used to form an oxide layer by a PECVD process (PETEOS). With plasma excitation, high deposition rates are obtained from TEOS/oxygen.

The process gas 112 is provided by an external pump (not shown) or similar mechanism. The process gas 112 flows into the space between the electrodes via the showerhead 106, which includes a series of outlet ports for adequately dispersing the process gas 112. The process gas 112 can include a suitable precursor gas, such as dichlorosilane or silane and oxygen precursors at suitable pressures. The process gas 112 flows about the chamber 130 and eventually exits at the byproduct exit location 110 as a byproduct. The pump 116 pulls or vacuums the unreacted process gas and byproducts from the chamber at a selected removal rate. The unreacted process gas and byproduct are then transferred to the scrubber 118 for cleaning. The cleaned gas can be reused or disposed of. In the embodiment illustrated in FIG. 1 exit location 110 located off center; however, in accordance with other embodiments of the present disclosure, exit location 110 is not located off center.

In other embodiments the process gas is introduced at one side of the chamber and an exhaust port is disposed at the opposite side of the chamber. The process gas flows through the chamber from the process gas inlet at one side of the chamber to the exhaust port on an opposite side of the chamber.

The plasma 104 deposits a selected material over or on a surface of the wafer 102. The selected material forms a film according to properties of the plasma 104 and the electric field. The film comprises a deposited material derived from the plasma 104. In one example, the deposited material is plasma deposited silicon nitride. The properties of the plasma 104 are at least partly dependent on the selected deposition rate.

After forming the film on the wafer 102, a cleaning gas 114 is used to remove any molecules or atoms from the process gas 112 and to remove any other residual materials from the chamber 130. The cleaning gas 114 flows through the showerhead 106, through the chamber 130, and leaves at the exit location 110.

CVD chambers are being designed to process single wafers of increasingly larger size, which can be integrated with other manufacturing process steps. As substrate size increases, operation of a CVD chamber needs to provide uniform deposited films, in other words, a film with less variation of thickness, on the substrate. Thus, controlling the conditions within the CVD chamber is important in order to reduce out of specification operation and rework rate.

Figure 2:
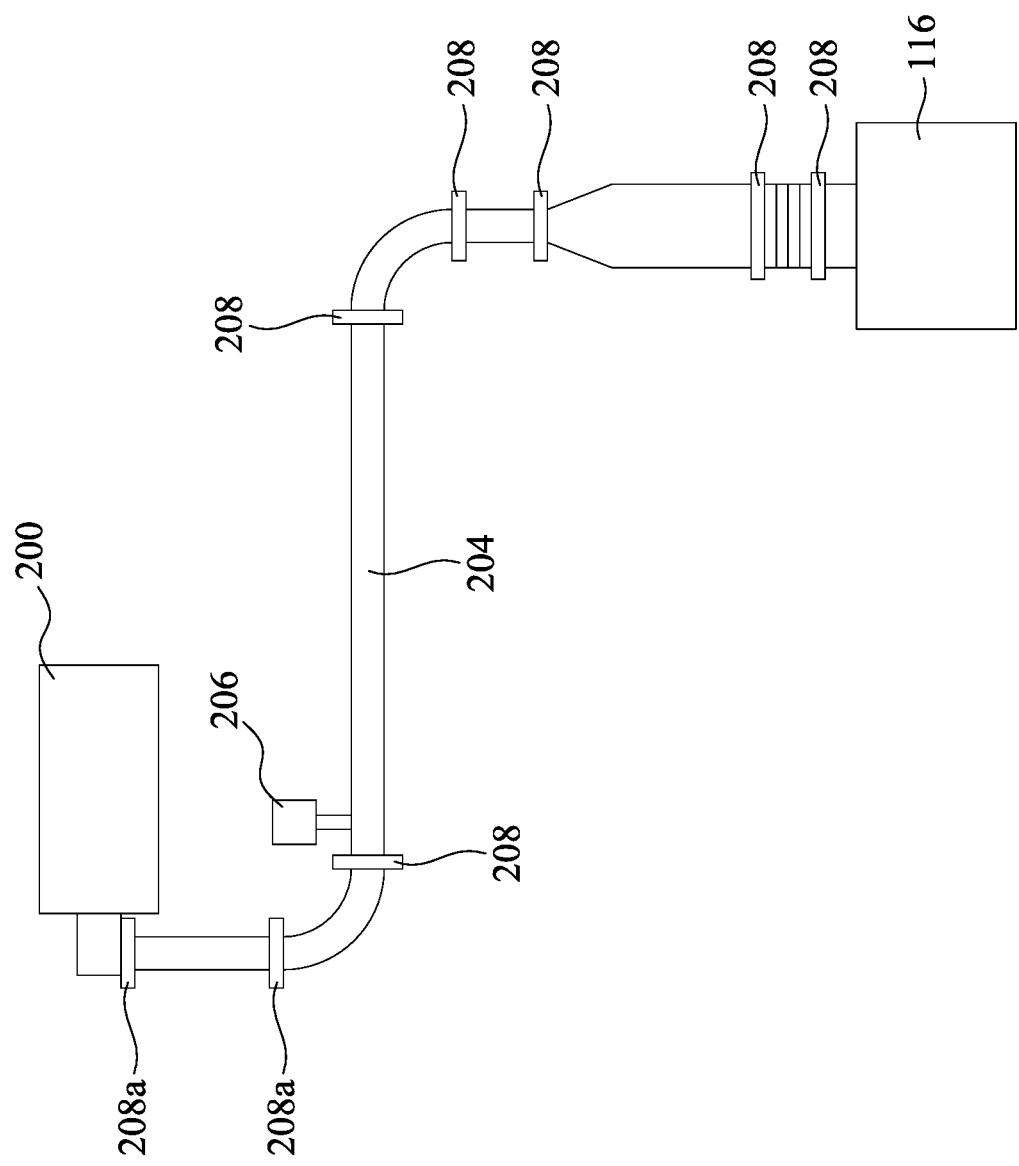
FIG. 2 is a schematic view of a tool exhaust gas conduit system for removing exhaust gas from a semiconductor processing chamber according to an embodiment in accordance with the present disclosure.

FIG. 2 is a schematic diagram of a chamber 200, such as a CVD chamber described above, from which an exhaust gas is removed via an exhaust gas conduit 204 in fluid communication with the chamber 200 and a fluid moving device, such as a pump 116. In accordance with some embodiments of the present disclosure, exhaust gas conduit 204 includes a plurality of sections separated by and joined together by a plurality of spaced apart couplings 208. A coupling 208a connects a section of the exhaust gas conduit 204 to an outlet coupling of chamber 200. A pressure gauge 206 is in fluid communication with an interior of exhaust gas conduit 204. Pressure gauge 206 detects pressure within exhaust gas conduit 204. Monitoring the pressure within exhaust conduit 204 allows operators to avoid a buildup in pressure within exhaust conduit 204 which could adversely affect processes carried out within chamber 200. Readings or signals from the pressure gauge 206 are communicated to a controller (not shown) which processes the signals and determines whether the signals indicate pressure within exhaust conduit 204 exceeds a predetermined value. The predetermined value is based upon a pressure observed when the cross-section of the interior of exhaust gas conduit 204 has been reduced below a threshold level by the deposition of components, from the exhaust gas, onto the interior of the exhaust conduit 204 or reaction of components of the exhaust gas with the interior surface of the exhaust gas conduit 204. Once the increase in pressure reaches the predetermined value, the control system that receives the pressure readings from pressure gauge 206 can issue a signal indicating that cleaning of the interior of exhaust gas conduit 204 is necessary.

Figure 3A:
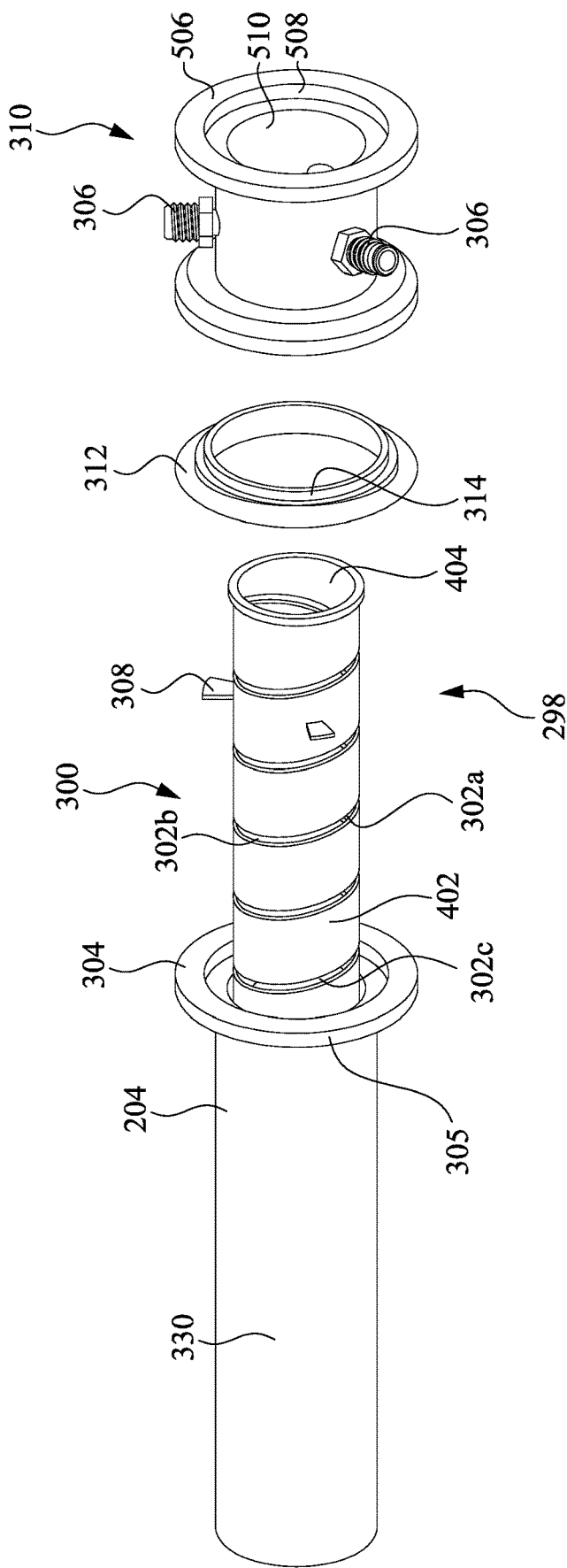
FIG. 3A is an exploded view of a conduit system for transporting a gas according to one embodiment described herein.
Figure 3B:
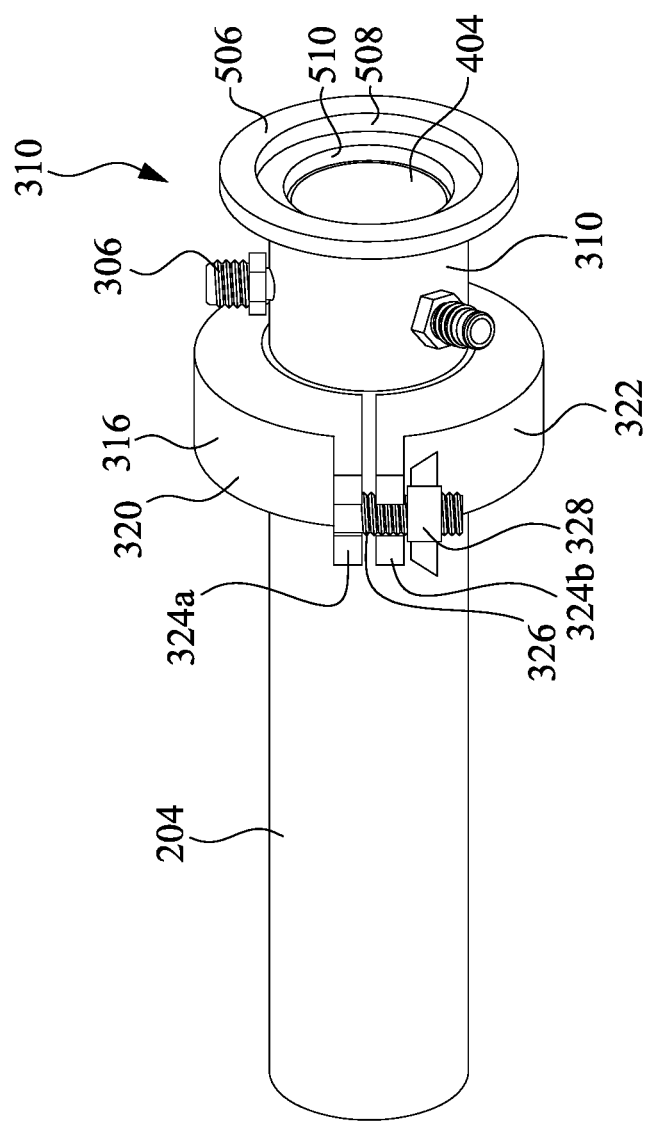
FIG. 3B is an assembled view of a conduit system for transporting a gas according to one embodiment described herein illustrated in FIG. 3A.

Referring to FIG. 3A, an exploded view of portion of exhaust gas conduit 204 and a gas curtain device 298 in accordance with an embodiment of the present disclosure are illustrated. In accordance with the illustrated embodiment, the gas curtain device 298 includes conduit liner 300, conduit joint 310, seal 313 and center ring 314. When assembled, as illustrated in FIG. 3B, an end surface 304 of exhaust gas conduit 204 is joined to an end surface (318 in FIG. 5) of conduit joint 310 by a clamp 316. Seal 313 and center ring 314 are sandwiched between the end surface 304 of exhaust gas conduit 204 and the end surface 318 of conduit joint 310 to provide a gas tight seal there between. In the illustrated embodiment, clamp 316 includes an upper member 320 and a lower member 322. Upper member 320 includes a clamp flange 324a and lower member 322 includes a corresponding clamp flange 324b. Clamp flange 324a and clamp flange 324b cooperate with a clamp bolt 326 and a clamp nut 328 to securely attach exhaust gas conduit 204 to conduit joint 310. Tightening of clamp nut 328 on clamp bolt 326 causes clamp flanges 324a and 324b to be drawn toward each other.

Figure 6:
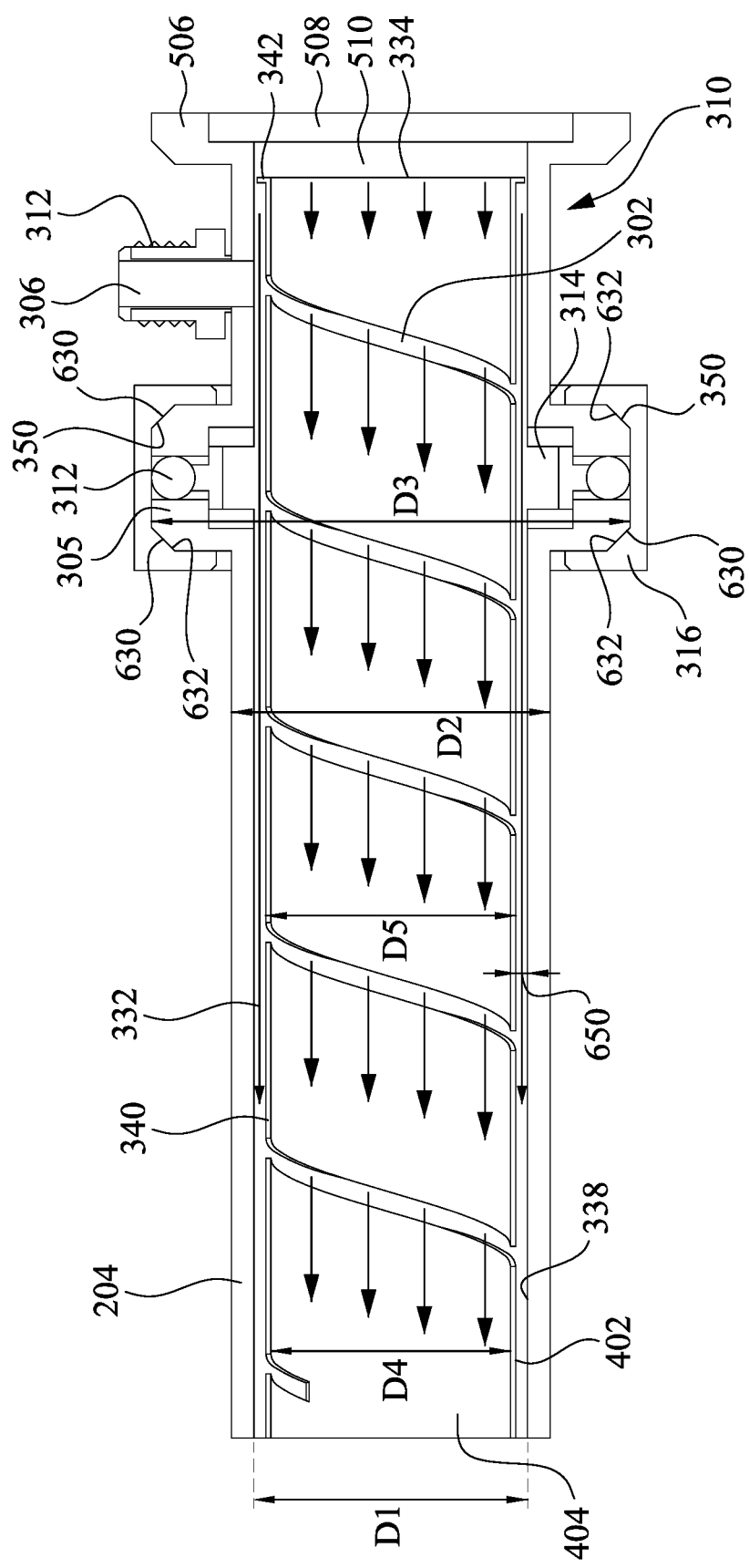
FIG. 6 is a side cross-sectional view of a conduit system for transporting a gas in accordance with an embodiment of the present disclosure.

Referring to FIG. 3A and FIG. 6, in the illustrated embodiment, exhaust gas conduit 204 includes a conduit body 330 and a flange 305 at end 304 of conduit body 330. In FIG. 3A, the end 304 of conduit body 330 opposite flange 305 communicates with pump 116 in FIG. 2. Exhaust gas conduit 204 includes an inner diameter (D1 in FIG. 6) and an outer diameter (D2 in FIG. 6). In an embodiment, the inner diameter D1 of exhaust gas conduit 204 ranges from 22 mm to 200 mm; however the present disclosure is not limited to an exhaust gas conduit 204 having an inner diameter D1 ranging from 22 mm to 200 mm. For example, embodiments in accordance with the present disclosure include an exhaust gas conduit 204 having an inner diameter D1 less than 22 mm or an exhaust conduit 204 having an inner diameter D1 that is greater than 200 mm. In an embodiment, exhaust gas conduit 204 has an outer diameter D2 that is about 5 to 10 mm greater than D1; however the present disclosure is not limited to an exhaust gas conduit 204 having an outer diameter D2 ranging from 5 mm to 10 mm greater than D1. For example, embodiments in accordance with the present disclosure include an exhaust gas conduit 204 having an outer diameter D2 less than 5 mm greater than D1 or an exhaust conduit 204 having an outer diameter D2 that is greater than 10 mm larger than D1. The flange 305 has an outer diameter D3 (in FIG. 6) that is greater than the outer diameter D2 of the body 330 of exhaust gas conduit 204. For example, outer diameter D3 of flange 305 is about 10-20 percent greater than the inner diameter D1. In other embodiments, outer diameter D3 is less than about 10% greater than inner diameter D1 and in other embodiments, outer diameter D3 is 20% greater than inner diameter D1. For example, in an embodiment, outer diameter D3 ranges between about 25 mm to 250 mm depending on the magnitude of inner diameter D1. In the illustrated embodiment of FIG. 3A, exhaust conduit 204 has a round cross-section; however, embodiments in accordance with the present disclosure are not limited to an exhaust conduit having a round cross-section. For example, exhaust conduit 204 can have a cross-section that is not round, for example, an oval or polygon cross-section.

Figure 4:
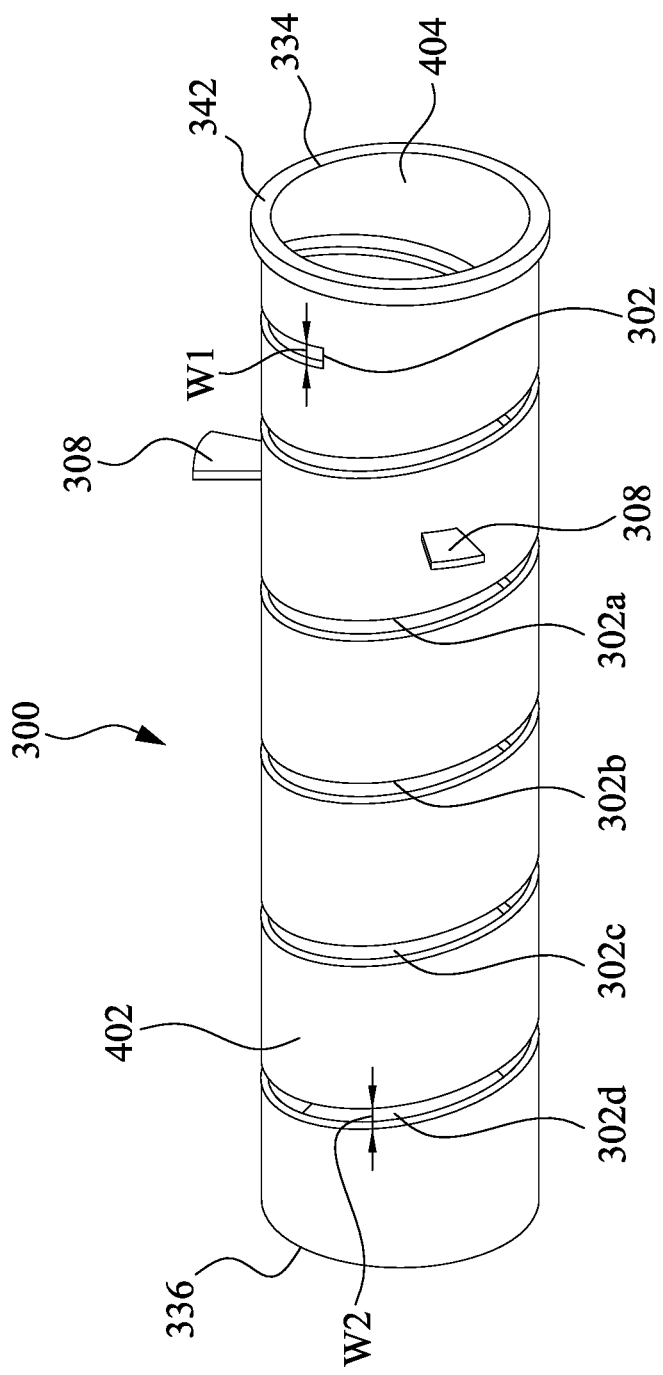
FIG. 4 is a side perspective view of a conduit liner of a conduit system in accordance with an embodiment of the present disclosure.

Continuing to refer to FIG. 3A and FIG. 6, in the illustrated embodiment, conduit liner 300 is a round tube including an annular wall having an external surface 402 and an internal surface 404. In other embodiments, conduit liner 300 is a tube that is not round, for example a tube that is oval or polygonal in cross-section. Conduit liner 300 includes a leading end 334 and a trailing end 336 (as shown in FIG. 4). The leading end 334 is upstream of the trailing end 336 relative to the direction exhaust gas flows through the exhaust gas conduit 204. The outer diameter D5 of the external surface 402 of conduit liner 300 is less than inner diameter D1 of the internal surface of the exhaust gas conduit 204 and internal diameter D4 of the internal surface 404 of the conduit liner 300 is less than its outer diameter D5. Due to these differences in diameter at the internal surface 338 of exhaust gas conduit 204 and the diameter at the external surface 402 of conduit liner 300, a curtain gas annulus 340 having a width 650 is defined between the external surface 402 of conduit liner 300 and the interior surface 338 of the exhaust gas conduit 204.

In an embodiment, diameter D5 ranges from about 85% to 95% of diameter D1; however, the present disclosure is not limited to diameter D5 being about 85% to 95% of diameter D1. For example, in other embodiments, diameter D5 is less than 85% of diameter D1. In other embodiments diameter D5 is greater than 95% and less than 99% of diameter D1. For example, in one embodiment, when the inner diameter D1 of exhaust gas conduit 204 is about 38 mm, the outer diameter D5 is in the range of 33 mm to 35 mm. In other embodiments, the inner diameter D1 is less than 38 mm, while in yet other embodiments, inner diameter D1 is greater than 38 mm. In such embodiments, diameter D5 is less than about 3-5 mm of the diameter D1 or greater than 3-5 mm of the diameter D1, respectively. In one embodiment, the thickness of the annular wall comprising the conduit liner 300 ranges from about 0.5 mm to about 1.0 mm; however the present disclosure is not limited to a conduit liner having an annular wall that is about 0.5 mm to about 1.0 mm thick. For example, in some embodiments, the thickness of the annular wall is greater than 1.0 mm and in other embodiments the thickness of the annular wall is less than 0.5 mm. The internal surface 404 of the annular wall of conduit liner 300 defines a passageway 332 through which exhaust gas from chamber 200 passes through conduit liner 300 along the length of conduit liner 300. The difference between D5 and D1 is in part selected based on the pressure of a curtain gas that is desired to be maintained within the curtain gas annulus 340 between the inner surface of the exhaust gas conduit 204 and the outer surface of the conduit liner 300.

The leading end 334 of conduit liner 300 includes a flange 342 that has an outer diameter substantially equal to the inner diameter D1 of exhaust gas conduit 204 (and conduit joint 310 as described below in more detail with reference to FIG. 5). In one embodiment, the flange 342 is press fit into the exhaust gas conduit 204, resulting in the leading end 334 of conduit liner 300 being sealed in a gas tight manner to the inner surface 338 of exhaust gas conduit 204 (or conduit joint 310). Such gas tight seal is not limited to being provided by a press fit between the outer circumference of flange 342 and the inner surface 338 of exhaust gas conduit 204 (or conduit joint 310). For example, a gas tight seal may be provided or supplemented by a polymeric sealing compound at the interface between the flange 342 and inner surface 338 of exhaust gas conduit. Alternatively, flange 342 can be welded to inner surface 338 of exhaust gas conduit 204 to provide a gas tight seal.

Conduit liner 300 between leading end 334 and trailing end 336 includes one or more conduit fingers 308 which extend radially outward from external surface 402 of conduit liner 300. In the illustrated embodiment of FIG. 4, two conduit fingers 308 are visible and they each have a rectangular or polygon shape. In other embodiments, conduit fingers 308 have a different shape than illustrated in FIG. 4, for example oval or partially round shapes. Conduit fingers 308 extend radially outward from external surface 402 of conduit liner 300 by a distance that causes the outward most end of conduit fingers 308 to each extend beyond the internal surface 338 of exhaust gas conduit 204. As described in more detail below, the amount by which conduit fingers 308 extend beyond the internal surface 338 of exhaust gas conduit 204 is not so large that the conduit fingers 308 impair the ability of clamp 316 to cooperate with flange 305 of exhaust gas conduit 204 and flange 344 of conduit joint 310 to restrain movement of conduit liner 300 along the length of exhaust gas conduit 204.

Conduit liner 300 between leading end 334 and trailing end 336 includes spiral gap 302 or vent that passes through the conduit liner 300 and travels from adjacent leading end 334 towards trailing end 336. In the illustrated embodiment, one spiral gap is shown; however, in other embodiments, more than one spiral gap is employed. In an embodiment, the spiral gap 302 has a width that is about equal to, i.e., about 100% of, the width of curtain gas annulus 340. For example, when curtain gas annulus 340 is 3 to 5 mm wide, spiral gap 302 has a width that ranges from about 3 mm to about 5 mm; however, as with the curtain gas annulus 340, the present disclosure is not limited to a spiral gap 302 that has a width that ranges from about 3 mm to 5 mm. For example, in accordance with other embodiments, conduit liner 300 includes a spiral gap 302 that has a width that is less than 3 mm. In accordance with other embodiments, spiral gap 302 has a width that is greater than 5 mm. Spiral gap 302 has a pitch, i.e., distance between adjacent spirals that is in a range of about 10 to 15 mm; however, the present disclosure is not limited to a spiral gap 302 having a pitch that is in a range of about 10 to 15 mm. For example, in other embodiments, the pitch is less than about 10 mm. In other embodiments, the pitch of spiral gap 302 is greater than 15 mm. Factors that go into selecting an appropriate width of the spiral gap 302, pitch of spiral gap 302 and the width of curtain gas annulus 340 include providing a sufficient pressure in the curtain gas annulus 340 such that curtain gas flows from curtain gas annulus 340 through spiral gap 302 into the interior of conduit liner 300 and flows in a laminar state along the internal surface 404 of exhaust gas conduit 204.

For example, in another embodiment, the width of the spiral gap 302 increases as the spiral gap 302 moves further away from the leading end 334 of conduit liner 300. In other words, the spiral gap closer to the trailing end 336 (e.g., at 302d, 302c, 302b and 302a) than the leading end 334 (i.e., gap at 302) has a width W2 that is greater than the width W1 of the spiral gap at 302 that is closer to the leading end 334 than the trailing end 336. The larger width of the spiral gap near the trailing end 336 helps to maintain the flow volume of the curtain gas through the spiral gap 302 as the pressure in the curtain gas annulus 340 decreases as the curtain gas flows within curtain gas annulus 340 from the leading end 334 of the conduit liner 300 to the trailing end 336 of the conduit liner 300. In another embodiment, the pitch of the spiral gap 302 decreases as the spiral gap 302 moves closer to the trailing end 336. This increasing pitch helps to maintain the flow volume of the curtain gas through the spiral gap 302 as the pressure in the curtain gas annulus 340 decreases as the curtain gas flows in the curtain gas annulus 340 from the leading end 334 of the conduit liner 300 to the trailing end 336 of the conduit liner 300. In another embodiment, baffles or flow restrictors (not shown) are positioned within curtain gas annulus 340. Such baffles or flow restrictors help maintain the pressure of the curtain gas in the curtain gas annulus 340 as the curtain gas flows in through the curtain gas annulus 340 in a direction 343 from the leading end 334 of the conduit liner 300 towards the trailing end 336 of the conduit liner 300.

In another embodiment, conduit liner 300 has an outer diameter D5 that increases along its length in a downstream direction. Such increasing outer diameter D5 of conduit liner 300 has the effect of decreasing the width of curtain gas annulus 340, provided the internal diameter D1 of exhaust gas conduit 204 remains constant. Alternatively, the internal diameter D1 of exhaust gas conduit 204 decreases along its length in a downstream direction. Such decreasing inner diameter D1 of exhaust gas conduit 204 has the effect of decreasing the width of curtain gas annulus 340, provided the outer diameter D5 of conduit liner 300 remains constant. For both these embodiments, the decreasing width of the curtain gas annulus 340 helps to maintain the pressure of the curtain gas as it travels downstream through the curtain gas annulus 340.

In some embodiments, conduit liner 300 is formed from a hard material that is not reactive with components of the exhaust gas or components of the curtain gas. For example, in accordance with one embodiment, conduit liner 300 is formed from a stainless steel. Embodiments in accordance with the present disclosure are not limited to a conduit liner 300 formed from stainless steel. For example, conduit liner 300 can be formed from a metal other than stainless steel or can be formed from an inert plastic material. Alternatively, the conduit liner 300 can be formed from a plastic material that is coated or lined with an inert material.

Figure 5:
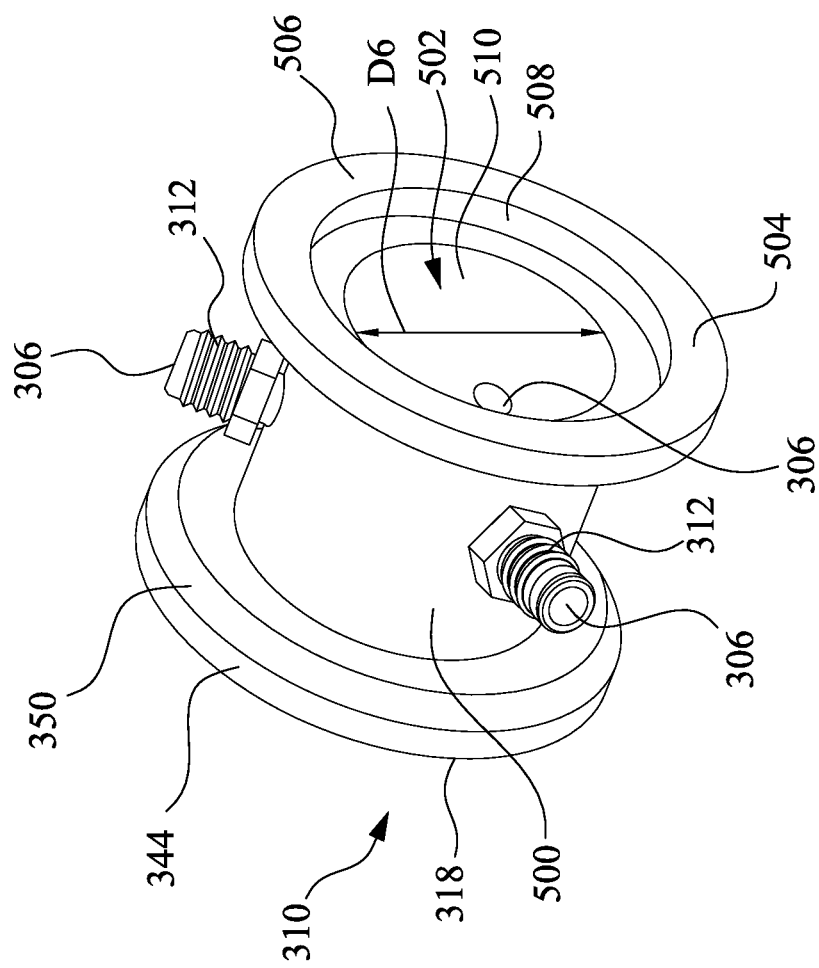
FIG. 5 is a side perspective view of a conduit joint of a conduit system in accordance with an embodiment of the present disclosure.

Referring to FIG. 5, an embodiment of a conduit joint 310 in accordance with the present disclosure includes a body 500. Body 500 is annular in shape and includes a bore 502 passing laterally through body 500. Body 500 includes a downstream end surface 318 and an upstream end surface 504. Downstream end surface 318 includes a flange 344 and upstream end surface 504 also includes a flange 506. Flanges 344 and 506 have an outer diameter that is substantially equal to the outer diameter D3 of flange 305 of exhaust gas conduit 204. For example, flanges 344 and 506 have an outer diameter that ranges between about 25 mm to 250 mm. Embodiments in accordance with the present disclosure are not limited to flanges 344 and 506 having an outer diameter ranging between 25 mm to 250 mm, for example, in other embodiments, flanges 344 and 506 have an outer diameter that is less than 25 mm or an outer diameter that is greater than 250 mm.

Flanges 344 and 506 include an inner diameter that is less than the outer diameter of flanges 344 and 506. Bore 502 includes an inner diameter D6 that is less than the inner diameter of flanges 344 and 506. This difference between the inner diameter of flanges 344 and 506 and the inner diameter D6 of bore 502 creates a seal seat 508 at the upstream end surface 504. Conduit joint 310 includes a similar seal seat at its downstream and surface 318; although such seal seat is not visible in FIG. 5. The body 500 of conduit joint 310 between flange 344 and flange 506 includes one or more gas inlet ports 306 which extend from an outer surface of the body 500 of conduit joint 310, through body 500, and to an interior surface 510 of conduit joint 310. In the illustrated embodiment, gas inlet ports 306 are round bores having an inner diameter ranging between about 5 mm to 15 mm; however, embodiments in accordance with the present disclosure are not limited to gas inlet ports 306 that have an inner diameter ranging between about 5 mm to 15 mm. For example, in some embodiments, the inlet ports 306 have an inner diameter that is less than 5 mm. In other embodiments, the inlet ports 306 have an inner diameter that is greater than 15 mm. In addition, while the illustrated embodiment of gas inlet ports 306 are round, the present disclosure is not limited to inlet ports 306 having a round cross-section. For example, in other embodiments, the inlet ports 306 have a cross-section that is not round, for example oval or polygon. In the embodiment illustrated in FIG. 5, each inlet port 306 includes a threaded gas nipple 312 that is either threaded into gas inlet port 306 or is secured to gas inlet port 306 by a different means, such as welding or brazing the gas nipple 312 to the body 500 of conduit joint 310. The threads of threaded ends of nipples 312 may be straight threads (NPS) or they may be tapered (NPT). Appropriate sealing materials such as sealing compound or polymeric tape can be utilized to provide a gas tight seal between the gas nipple 312 and the body 500 of conduit joint 310. In the embodiment illustrated in FIG. 5, three threaded nipples 312 and three gas inlet ports 306 are illustrated. Embodiments in accordance with the present disclosure are not limited to three threaded nipples 312 or three gas inlet ports 306. For example, in other embodiments more than three or fewer than three threaded nipples 312 or gas inlet ports 306 are provided. In the embodiment of FIG. 5, the threaded nipples 312 are shown as being equally spaced around the outer circumference of body 500; however, in other embodiments, the threaded nipples 312 are not equally spaced around the outer circumference of body 500. Threaded nipples 312 are configured to receive female threaded couplings for securing a supply of curtain gas to the respective threaded nipples 312.

Referring to FIG. 3B, clamp 316 is positioned around flange 305 of exhaust gas conduit 204 and around flange 344 of conduit joint 310. In the embodiment of FIGS. 3B and 6, flange 342 of conduit liner 300 is sealed to the inner surface 510 (as shown in FIG. 5) of conduit joint 310. A seal 313, such as an elastomeric seal, is supported on a center ring 314 which is positioned within clamp 316 between flange 344 of conduit joint 310 and flange 305 of exhaust gas conduit 204. Seal 313 contacts trailing end of flange 344 and leading end of flange 305 and when compressed, creates a gas tight seal between these surfaces. Seal 313 has an outer diameter that is substantially equal to the inner diameter of clamp 316. In some embodiments, seal 313 is compressible so when not compressed, its outer diameter can be slightly greater than the inner diameter of clamp 316. Seal 313 is supported by center ring 314. Center ring 314 has an outer diameter that is about equal to the inner diameter of seal 313. Inner diameter of center ring 314 is equal to or slightly greater than the outer diameter D5 of conduit liner 300. Inner diameter of center ring 314 is sized so that conduit liner 300 is able to slide within center ring 314, i.e., center ring 314 slides over and onto conduit liner 300. The outer circumference of center ring 314 includes an arcuate surface onto which an inner circumference of seal 313 is received.

When clamp nuts 328 are tightened on bolts 326 to bring clamp flanges 324a, 324b, and bolts 326 closer together, the clamp 316 imparts a compression force on flanges 305 and 344 in both a lateral and radial direction. The inner surface of clamp 316 includes beveled surface 630 that cooperates with the beveled surface 350 of conduit joint 310 and beveled surface 632 of flange 305 of exhaust gas conduit 204, such that as the two halves of clamp 316 are drawn together beveled surfaces 630 apply a lateral force to beveled surface 350 and beveled surface 632 drawing exhaust gas conduit 204 and conduit joint 310 closer together and thereby compressing seal 313. When assembled as illustrated in FIG. 6, exhaust gas conduit 204 is sealed in a gas tight manner to conduit joint 310. Though not shown, conduit joint 310 is connected in a gas tight manner to a gas conduit that delivers exhaust gas from chamber 200 to conduit joint 310.

In operation, the exhaust gas from chamber 200 is received by conduit joint 310. The exhaust gas flows in direction 332 through conduit joint 310 and into exhaust gas conduit 204 where it flows within the conduit liner 300. At the leading end 334 of conduit liner 300, flange 342 prevents exhaust gas from entering curtain gas annulus 340. A curtain gas or purge gas, i.e., an inert gas that does not react with gases that are contained in the exhaust gas to form materials that deposit onto surfaces of the exhaust gas conduit 204 and/or surfaces of the conduit liner 300, is introduced into gas inlet ports 306. The curtain gas passes into the curtain gas annulus 340 and flows in the curtain gas annulus 340 along the length of the conduit liner 300. A portion of the curtain gas in curtain gas annulus 340 passes through spiral gaps 302 and forms a gas curtain adjacent the inner surface 404 of conduit liner 300. Pressure of the curtain gas in curtain gas annulus 340 is greater than the pressure of the gas flowing through the conduit liner 300. This pressure differential prevents or minimizes an amount of exhaust gas that passes through spiral gaps 302 into curtain gas annulus 340 and instead promotes the flow of curtain gas through spiral gaps 302 into the interior of conduit liner 300 where the curtain gas forms a laminar flow of curtain gas adjacent the internal surface 404 of conduit liner 300. Laminar flow is a type of fluid (gas or liquid) flow in which the fluid travels smoothly or in regular paths, in contrast to turbulent flow, in which the fluid undergoes irregular fluctuations and mixing. In laminar flow, sometimes called streamline flow, the velocity, pressure, and other flow properties at each point in the fluid remain constant. Laminar flow over a horizontal surface may be thought of as consisting of thin layers, or laminae, all parallel to each other. The fluid in contact with the horizontal surface is stationary, but all the other layers slide over each other. Details regarding the width of gaps 302, pitch between gaps 302 and regularity of the pitch between gaps as parameters that can be varied to manage the pressure in curtain gas annulus 340 and to promote a laminar flow of curtain gas adjacent the inner surface of conduit liner 300 are described above in are not repeated here. Flow of a fluid can be characterized by a Reynolds number, which is a function of the density of the flowing fluid, the flow speed of the fluid, a characteristic linear dimension and the dynamic viscosity of the fluid. For flow in a pipe of diameter D, experimental observations show that for "fully developed" flow, laminar flow occurs when $Re_D > 2300$ and turbulent flow occurs when $Re_D > 2900$. At the lower end of this range, a continuous turbulent-flow will form, but only at a very long distance from the inlet of the pipe. The flow in between will begin to transition from laminar to turbulent and then back to laminar at irregular intervals, called intermittent flow. This is due to the different speeds and conditions of the fluid in different areas of the pipe's cross-section, depending on other factors such as pipe roughness and flow uniformity. Turbulent flow tends to dominate in the fast-moving center of the pipe while slower-moving laminar flow dominates near the wall. As the Reynolds number increases, the continuous turbulent-flow moves closer to the inlet and the intermittency in between increases, until the flow becomes fully turbulent at $Re_D$>2900. In accordance with some embodiments of the present disclosure the fluid flow within exhaust gas conduit 204, within curtain gas annulus 340 and/or within conduit liner 300 is characterized by a Reynold number of 2300 or lower indicating a laminar flow regime. In other embodiments, the Reynolds number for the fluid flow within exhaust gas conduit 204, within curtain gas annulus 340 and/or within conduit liner 300 is less than 2200 or less than 2000.

In the embodiment of FIG. 6 one conduit joint 310 where curtain gas is introduced into an exhaust gas conduit 204 and conduit liner 300 is illustrated along with one length of conduit liner 300. In such embodiment, curtain gas is introduced at one location of the exhaust gas conduit 204 and conduit liner 300. Thus, the length of the curtain gas annulus 340 is substantially equal to the length of the conduit liner 300 that is provided within the exhaust gas conduit 204. Embodiments in accordance with the present disclosure are not limited to introducing curtain gas at only one location into exhaust gas conduit 204. For example, in other embodiments, multiple conduit joints 310 can be utilized to connect multiple sections of exhaust gas conduit 204 that would each include their own individual conduit liner 300 and accordingly their own curtain gas annulus 340. In such embodiments, the downstream end of curtain gas annulus includes an additional flange at trailing end 336 of conduit liner 300. For example referring to FIG. 2, each coupling 208 can comprise a conduit joint 310 connecting shorter sections of exhaust gas conduit 204 that each include their own individual conduit liner 300 and curtain gas annulus 340. In such embodiments, the curtain gas introduced into respective sections of exhaust gas conduit 204, each with their own individual conduit liners 300, would flow in their respective curtain gas annulus 340 until reaching the flange at trailing end 336 of conduit liner 300. In such an embodiment, the curtain gas annulus 340 of adjacent sections of exhaust gas conduit 204/conduit liner 300 are separated from each other with respect to the curtain gas, such that curtain gas in an upstream curtain gas annulus 340 is prevented from flowing directly into the curtain gas annulus 340 of an immediately downstream section of exhaust gas conduit 204. With such an arrangement, the shorter lengths of the curtain gas annulus 340 result in less pressure drop in the curtain gas annulus 340 compared to a curtain gas annulus of a longer length. Thus, in accordance with embodiments of the present disclosure, an alternative way of managing the pressure drop in the curtain gas annulus 340 is to provide curtain gas annuluses that are isolated from each other and shorter in length.

Figure 7:
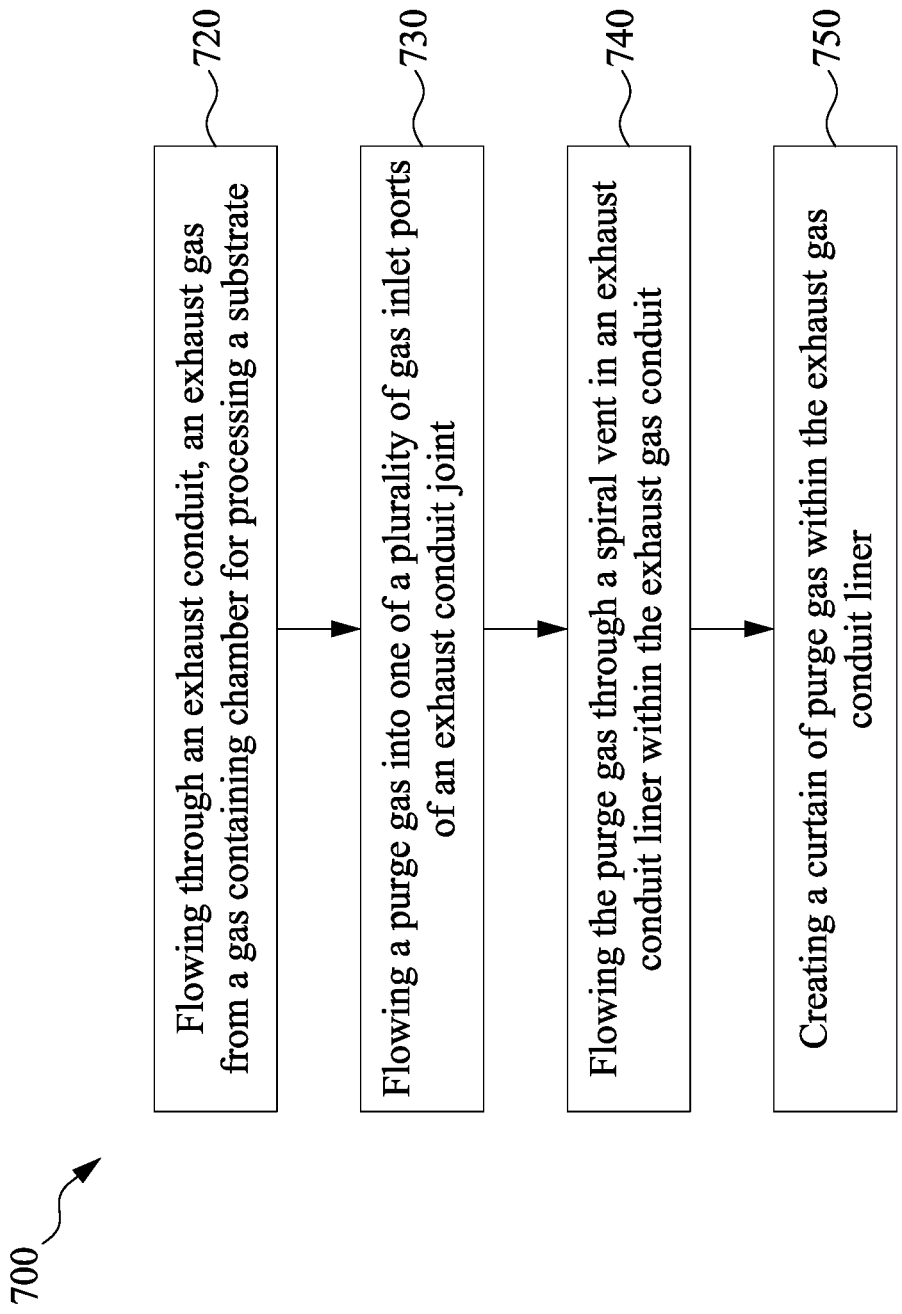
FIG. 7 is a flow chart of a method for transporting a gas in accordance with an embodiment of the present disclosure.

Referring to FIG. 7, a method 700 for transporting a gas, for example, from a chamber for processing a semiconductor workpiece in accordance with an embodiment of the present disclosure includes step 720 of flowing, through an exhaust conduit, an exhaust gas from the gas containing processing chamber. The method 700 includes at step 730 flowing a purge gas into one of the plurality of gas inlet ports of an exhaust conduit joint in fluid communication with the exhaust conduit. Step 740 of method 700 includes flowing the purge gas through a spiral vent in an exhaust conduit liner within the exhaust gas conduit. At step 750, the purge gas forms a curtain of purge gas within the exhaust gas conduit.

In one embodiment of the present disclosure, a gas curtain device is provided that includes a conduit liner which includes a spiral vent. The conduit liner is located in a gas conduit designed to transport exhaust gas from a semiconductor workpiece processing chamber. The gas curtain device further includes a conduit joint, including a plurality of gas inlet ports, surrounding a portion of the conduit liner. The gas inlet ports being in fluid communication with the spiral vent of the conduit liner.

In another embodiment of the present disclosure, a method for transporting gas is described that includes flowing, through an exhaust conduit, an exhaust gas from a gas containing chamber for processing a semiconductor workpiece. The method includes flowing a purge gas or curtain gas into a plurality of gas inlet ports of a conduit joint, the gas inlet ports in fluid communication with the exhaust conduit. In accordance with this embodiment, the purge gas is flowed through a spiral vent in an exhaust conduit liner located within the exhaust gas conduit. The purge gas that flows through the spiral vent creates a curtain of purge gas adjacent an internal surface of the exhaust gas conduit liner. This gas curtain isolates the internal surface of the exhaust gas conduit from components of the exhaust gas that would otherwise deposit onto the internal surface of the exhaust gas conduit, thereby preventing buildup of deposited materials on the internal surface of the exhaust gas conduit.

In another embodiment, a conduit system for transporting a gas is described. The conduit system includes a conduit, a conduit liner that includes a spiral vent and a conduit joint surrounding a portion of the conduit liner and surrounding a portion of the conduit. The conduit joint includes a plurality of gas inlet ports that are in fluid communication with the spiral vent and deliver a purge gas to the interior of the conduit. A seal is provided between the conduit and the conduit joint to prevent gas leakage. In some embodiments, the width of the spiral vent is variable along the length of the conduit liner.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A gas curtain device comprising:
a conduit liner, the conduit liner including a spiral vent passing though the conduit liner and a conduit finger extending from an exterior surface of the conduit liner; and
a conduit joint surrounding a portion of the conduit liner, the conduit joint including a plurality of gas inlet ports in fluid communication with the spiral vent of the conduit liner.

2. The gas curtain device of claim 1, wherein the conduit liner has an outside diameter that is less than an inside diameter of the conduit joint.

3. The gas curtain device of claim 1, wherein the plurality of gas inlet ports is three or more.

4. The gas curtain device of claim 1, wherein the spiral vent has a width W1 measured along length of the conduit liner near the conduit joint and the spiral vent has a width W2 measured along the length of the conduit liner at a location that is further from the conduit joint than a location where W1 is measured, W2 being larger than W1.

5. The gas curtain device of claim 1, further comprising a seal contacting the conduit joint.

6. The gas curtain device of claim 1, wherein the conduit liner has an outer diameter and the conduit joint has an inner diameter, the outer diameter of the conduit liner being less than the inner diameter of the conduit joint.

7. The gas curtain device of claim 1, wherein an end of the conduit liner includes a flange.

8. The gas curtain device of claim 1, wherein a pitch between adjacent sections of the spiral vent along a length of the conduit liner is variable.

9. A method for transporting a gas, comprising:
flowing, through an exhaust conduit, an exhaust gas from a gas containing chamber for processing a substrate;
flowing a purge gas into one of a plurality of gas inlet ports of an exhaust conduit joint;
flowing the purge gas through a spiral vent in an exhaust conduit liner within the exhaust gas conduit, the spiral vent having a width W1 measured along length of the exhaust conduit liner and the spiral vent in the exhaust conduit liner having a width W2 measured along the length of the exhaust conduit liner at a location downstream of a location where W1 is measured, W2 being larger than W1; and
creating a curtain of purge gas along an internal surface of the exhaust conduit liner.

10. The method of claim 9, wherein the exhaust gas conduit liner has an outer diameter and the exhaust conduit has an inner diameter, the outer diameter of the exhaust conduit liner being less than the inner diameter of the exhaust conduit.

11. The method of claim 10, wherein the outer diameter of the exhaust conduit liner is 85-95% of the inner diameter of the exhaust conduit.

12. The method of claim 9, wherein the flowing a purge gas into a plurality of gas inlet ports in an exhaust conduit joint includes flowing the purge gas into three or more purge gas inlet ports in the exhaust conduit joint.

13. The method of claim 9, wherein the conduit liner includes a conduit finger extending from an exterior surface of the conduit liner.

14. A conduit system for transporting a gas comprising:
a conduit in fluid communication with a processing chamber for a semiconductor substrate;
a conduit liner within the conduit, the conduit liner including a spiral vent, the width of the spiral vent being variable along the length of the conduit liner;
a conduit joint surrounding a portion of the conduit liner and surrounding a portion of the conduit, the conduit joint including a plurality of gas inlet ports and an internal surface that includes a beveled surface, the gas inlet ports in fluid communication with an interior of the conduit; and
a seal between the conduit and the conduit joint.

15. The conduit system of claim 14, further comprising a conduit finger extending from an exterior of the conduit liner, the conduit finger contacting the conduit.

16. The conduit system of claim 14, wherein the conduit liner has an outer diameter and the conduit having an inner diameter, the outer diameter of the conduit liner being less than the inner diameter of the conduit.

17. The conduit system of claim 14, wherein a pitch between adjacent sections of the spiral vent along a length of the conduit liner is variable.

18. The conduit system of claim 14, wherein the plurality of gas inlet ports is three or more.

19. The conduit system of claim 14, wherein the spiral vent has a width W1 measured along length of the conduit liner near the conduit joint and the spiral vent has a width W2 measured along the length of the conduit liner at a location that is further from the conduit joint than a location where W1 is measured, W2 being larger than W1.

20. The conduit system of claim 14, wherein an end of the conduit liner includes a flange.

* * * * *